United States Patent
Wada et al.

(10) Patent No.: US 6,797,416 B2
(45) Date of Patent: Sep. 28, 2004

(54) GAN SUBSTRATE FORMED UNDER CONTROLLED GROWTH CONDITION OVER GAN LAYER HAVING DISCRETELY FORMED PITS

(75) Inventors: Mitsugu Wada, Kaisei-machi (JP); Toshiaki Kuniyasu, Kaisei-machi (JP); Toshiaki Fukunaga, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/391,564

(22) Filed: Mar. 20, 2003

(65) Prior Publication Data

US 2003/0180580 A1 Sep. 25, 2003

(30) Foreign Application Priority Data

Mar. 20, 2002 (JP) ........................................ 2002-077672

(51) Int. Cl.⁷ .............................. B32B 9/00; B32B 3/10; H01L 21/02
(52) U.S. Cl. ........................ 428/698; 428/620; 428/697; 428/131; 428/220; 438/694; 438/697; 438/761
(58) Field of Search .................................. 428/698, 697, 428/620, 220, 131; 438/761, 694, 697; 117/84

(56) References Cited

U.S. PATENT DOCUMENTS

| 6,121,634 A | * | 9/2000 | Saito et al. | .................... 257/86 |
| 6,440,823 B1 | * | 8/2002 | Vaudo et al. | ................ 438/478 |
| 6,468,347 B1 | * | 10/2002 | Motoki et al. | ................. 117/89 |
| 6,555,167 B2 | * | 4/2003 | Sone et al. | ........... 427/255.394 |
| 6,555,846 B1 | * | 4/2003 | Watanabe et al. | .............. 257/94 |
| 2003/0006211 A1 | * | 1/2003 | Fukunaga et al. | .............. 216/2 |

FOREIGN PATENT DOCUMENTS

| EP | 1276140 A2 | * | 1/2003 | ........... H01L/21/20 |
| JP | 11220169 A | * | 8/1999 | ........... H01L/33/00 |

OTHER PUBLICATIONS

Japanese Journal of Applied Physics, vol. 37, 1998, part 2, pp. 1020–1022.

* cited by examiner

*Primary Examiner*—Stephen Stein
(74) *Attorney, Agent, or Firm*—Sughrue Mion, PLLC

(57) ABSTRACT

In a process for producing a substrate for use in a semiconductor element: a first GaN layer having a plurality of pits at its upper surface is formed; and then a second GaN layer is formed by growing a GaN crystal over the first GaN layer until the upper surface of the second GaN layer becomes flattened. Each of the above plurality of pits has an opening area of 0.005 to 100 $\mu m^2$ and a depth of 0.1 to 10.0 $\mu m$.

24 Claims, 6 Drawing Sheets

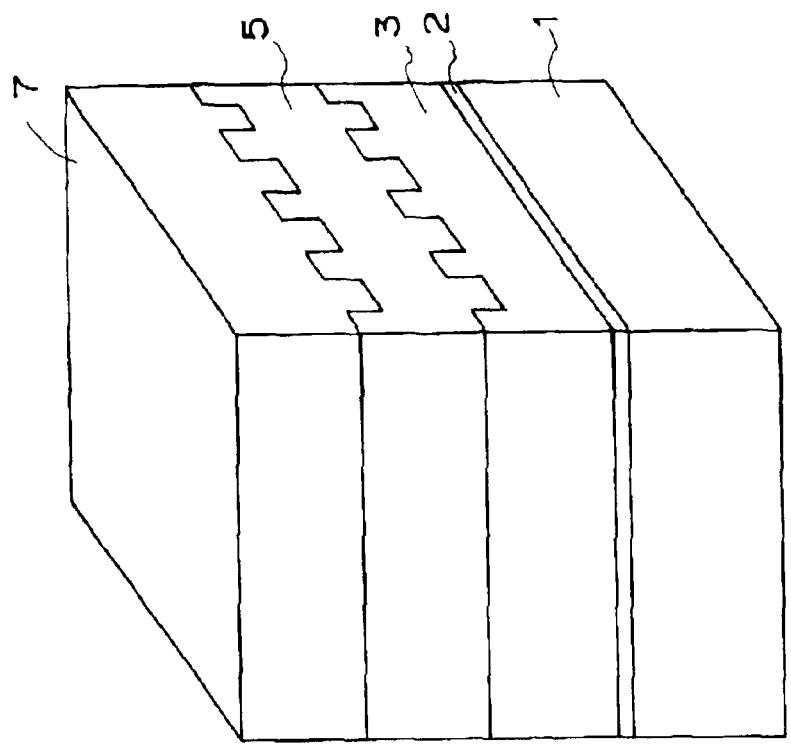
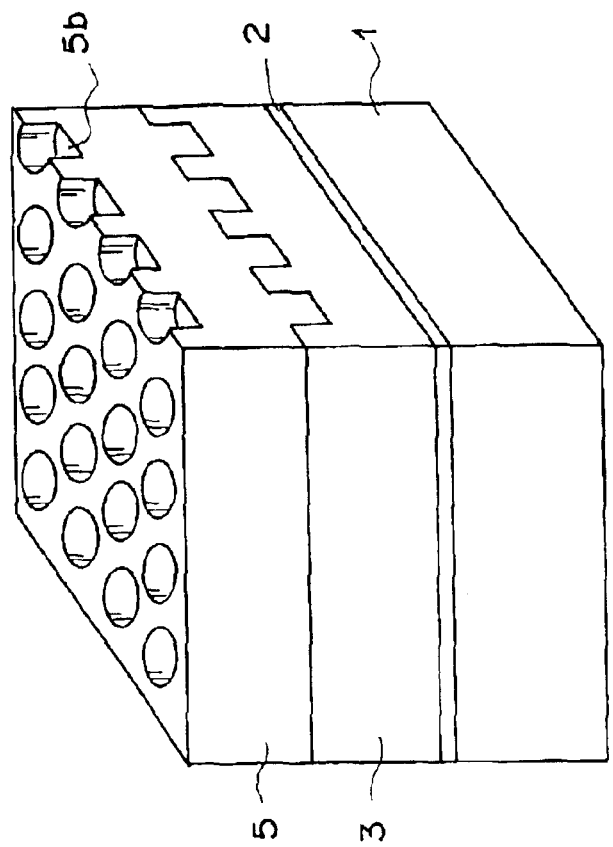
FIG.2A
FIG.2B

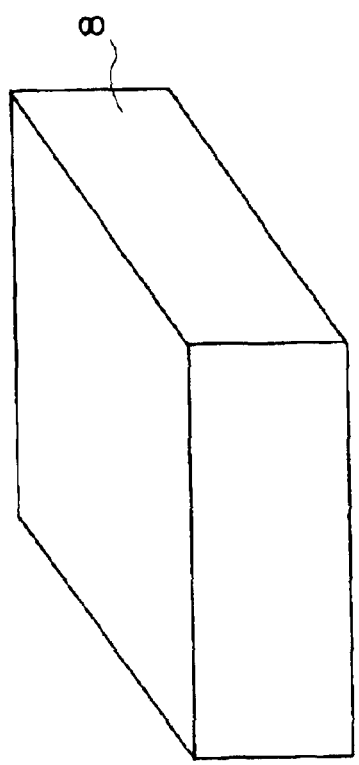
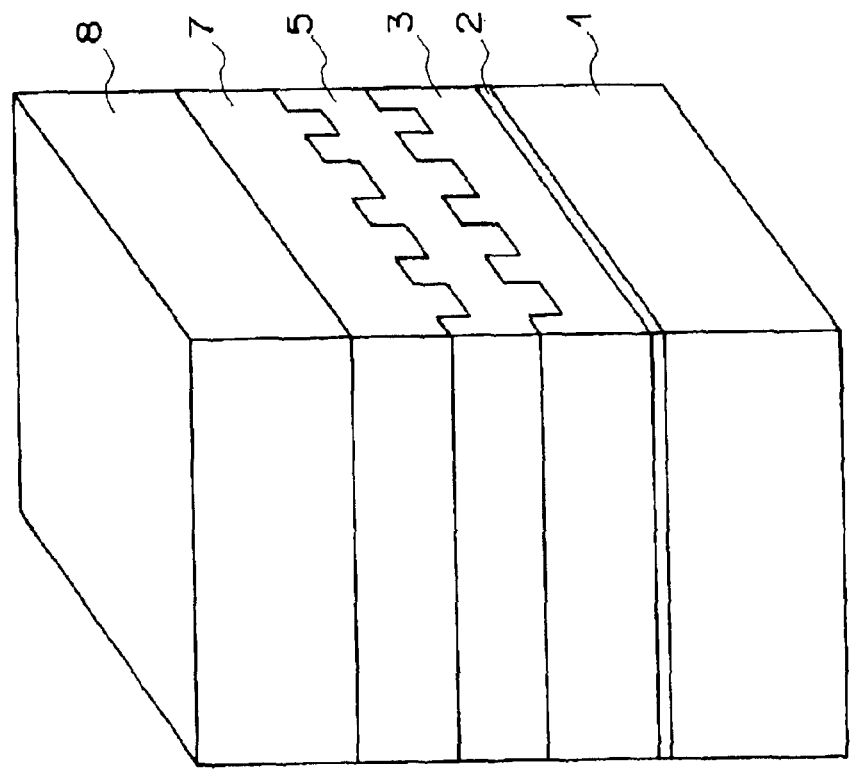
FIG.4B
FIG.4A

GAN SUBSTRATE FORMED UNDER CONTROLLED GROWTH CONDITION OVER GAN LAYER HAVING DISCRETELY FORMED PITS

BACKGROUND OF THE INVENTION

1. Field of the Invention

The present invention relates to a substrate which is used in a semiconductor element. The present invention also relates to a process for producing a substrate which is used in a semiconductor element. The present invention further relates to a semiconductor element which uses the above substrate.

2. Description of the Related Art

Japanese Journal of Applied Physics Vol. 37 (1998) Part 2, pp. L1020 discloses a short-wavelength semiconductor laser device which emits laser light in the 410 nm band. This semiconductor laser device is produced as follows. First, a GaN layer is formed on a sapphire substrate, a striped pattern of a $SiO_2$ film is formed on the GaN layer, and a GaN thick film is formed by selective lateral growth from nuclei of growth generated in stripe areas of the GaN layer which are not covered by the striped pattern of the $SiO_2$ mask. Then, a GaN substrate is obtained by separating the GaN thick film from the sapphire substrate. Next, an n-type GaN buffer layer, an n-type InGaN crack prevention layer, an n-type AlGaN/GaN modulation doped superlattice cladding layer, an n-type GaN optical waveguide layer, an n-type InGaN/InGaN multiple-quantum-well active layer, a p-type AlGaN carrier block layer, a p-type GaN optical waveguide layer, a p-type AlGaN/GaN modulation doped superlattice cladding layer, and a p-type GaN contact layer are formed on the above GaN substrate. However, the highest output power obtained in the fundamental transverse mode by the above semiconductor laser device is about 30 mW, and the semiconductor laser device is reliable in only the output power range up to 30 mW.

Since the conventional ELOG (epitaxial lateral overgrowth) substrates as above are produced by selective lateral growth from nuclei of growth generated in stripe areas of a GaN layer which are not covered by a $SiO_2$ mask, defects are reduced in the region produced by the selective lateral growth of GaN.

Nevertheless, according to the conventional method as above, the density of the nuclei for growth is high, and therefore the spaces between the nuclei are bridged before the grown nuclei become large. Thus, defects are likely to be produced in the bridged regions. Although the GaN thick film is required to have a certain thickness in order to use the GaN thick film as a substrate, the defect density is increased with increase in the thickness. Even when the defect densities in the bridged regions are low, the defect densities increase with the increase in the thickness. Consequently, it is difficult to form a wide low-defect region. That is, the conventional ELOG substrates have only a narrow low-defect region.

In order to realize a reliable semiconductor laser device, an optical waveguide is required to be formed on a low-defect region of a substrate. Therefore, the conventional ELOG substrates are effective for producing semiconductor laser devices having a narrow stripe structure as disclosed in the aforementioned reference. However, it is impossible to form a reliable semiconductor laser device having a broad stripe structure on the conventional ELOG substrates.

In order to realize a reliable semiconductor laser device having high output power, the semiconductor laser device is required to have a broad stripe structure, and in order to realize a reliable semiconductor laser device having a broad stripe structure, the semiconductor laser device is required to be formed on a GaN substrate which includes a wide low-defect region, instead of the conventional ELOG substrates.

Generally, reliability of every semiconductor element constituted by semiconductor layers formed on a substrate, including the semiconductor laser element, depends on the defect density in the substrate. Therefore, a substrate including a wide low-defect region is required for all types of semiconductor elements.

SUMMARY OF THE INVENTION

An object of the present invention is to provide a substrate which is used in a semiconductor element, and in which the defect density is low in a wide region.

Another object of the present invention is to provide process for producing a substrate which is used in a semiconductor element, and in which the defect density is low in a wide region.

A further object of the present invention is to provide a semiconductor element which uses a substrate in which the defect density is low in a wide region.

(1) According to the first aspect of the present invention, there is provided a process for producing a substrate for use in a semiconductor element, comprising the steps of: (a) forming a first GaN layer having a plurality of pits at the upper surface of the first GaN layer, where each of the plurality of pits has an opening area of 0.005 to 100 $\mu m^2$ and a depth of 0.1 to 10.0 $\mu m$; and (b) forming a second GaN layer by growing a GaN crystal over the first GaN layer until the upper surface of the second GaN layer becomes flattened.

According to the first aspect of the present invention, the density of nuclei for growth can be reduced compared with the conventional substrates, and therefore it is possible to obtain a GaN layer in which the defect density is low in a wide region.

Preferably, the following sequence of operations may be performed once or a plurality of times on the second GaN layer of the substrate obtained by the process according to the first aspect of the present invention. The sequence includes the steps of formation of a plurality of pits at the upper surface of an uppermost GaN layer, and formation of an additional GaN layer by growing a crystal over the uppermost GaN layer until the upper surface of the additional GaN layer becomes flattened, where each of the plurality of pits has an opening area of 0.005 to 100 $\mu m^2$ and a depth of 0.1 to 10.0 $\mu m$. When the sequence is repeated, the uppermost GaN layer in which the plurality of pits are formed in each repeat sequence is the second GaN layer formed in the step (b) in the process according to the first aspect of the present invention or the additional GaN layer formed in the preceding repeat sequence. By repeating the above sequence, a GaN layer in which the defect density is further reduced can be obtained.

According to the second aspect of the present invention, there is provided a process for producing a substrate for use in a semiconductor element, comprising the steps of: (a) forming a first GaN layer having a plurality of pits at the upper surface of the first GaN layer, where each of the plurality of pits has an opening area of 0.005 to 100 $\mu m^2$ and a depth of 0.1 to 10.0 $\mu m$; (b) forming a second GaN layer by growing a GaN crystal over the first GaN layer under a growth condition under which facets each making an angle of 20 to 70 degrees with the upper surface of the first GaN layer are formed, until a ratio of a total area of portions of the upper surface of the second GaN layer which are parallel to the upper surface of the first GaN layer to a total area of the entire upper surface of the second GaN layer becomes 30% or smaller; and (c) forming a third GaN layer by growing a GaN crystal over the second GaN layer until the upper surface of the third GaN layer becomes flattened.

According to the second aspect of the present invention, the density of nuclei for growth can be reduced compared with the conventional substrates, and therefore it is possible to obtain a GaN layer in which the defect density is low in a wide region.

Preferably, the following sequence of operations may be performed once or a plurality of times on the second GaN layer of the substrate obtained by the process according to the first aspect of the present invention. The sequence includes the steps of: formation of a plurality of pits at the upper surface of an uppermost GaN layer; formation of a first additional GaN layer by growing a GaN crystal over the uppermost GaN layer under a growth condition under which facets each making an angle of 20 to 70 degrees with the upper surface of the uppermost GaN layer, until a ratio of a total area of portions of the upper surface of the first additional GaN layer which are parallel to the upper surface of the uppermost GaN layer to a total area of the upper surface of the first additional GaN layer becomes 30% or smaller; and growth of a second additional GaN layer over the first additional GaN layer until the upper surface of the second additional GaN layer becomes flattened, where each of the plurality of pits has an opening area of 0.005 to 100 $\mu m^2$ and a depth of 0.1 to 10.0 $\mu m$. When the sequence is repeated, the uppermost GaN layer in which the plurality of pits are formed in each repeat sequence is the third GaN layer formed in the step (c) in the process according to the second aspect of the present invention or the second additional GaN layer formed in the preceding repeat sequence. By repeating the above sequence, a GaN layer in which the defect density is further reduced can be obtained.

As explained above, when a substrate for use in production of a semiconductor element is produced by the processes according to the first or second aspect of the present invention or one of their preferable modifications, the substrate includes a GaN layer in which the defect density is low in a wide region. Therefore, the reliability of semiconductor elements formed on substrates which are produced by the processes according to the first and second aspects of the present invention and their preferable modifications is high.

(2) According to the third aspect of the present invention, there is provided a semiconductor element comprising: a substrate produced by the process according to the first aspect of the present invention; and at least one semiconductor layer formed on the substrate.

According to the fourth aspect of the present invention, there is provided a semiconductor element comprising: a substrate produced by the process according to the second aspect of the present invention; and at least one semiconductor layer formed on the substrate.

Since, in the semiconductor element according to the third or fourth aspect of the present invention, at least one semiconductor layer is formed on a substrate produced by the process according to the first or second aspect of the present invention, the defect density in the substrate is low. Therefore, the reliability of the semiconductor elements according to the third and fourth aspect of the present invention is high.

(3) According to the fifth aspect of the present invention, there is provided a substrate for use in a semiconductor element, comprising: a first GaN layer having a plurality of pits each of which has an opening area of 0.005 to 100 $\mu m^2$ and a depth of 0.1 to 10.0 $\mu m$; and a second GaN layer being formed by crystal growth over the first GaN layer and having a flattened upper surface.

Since the substrate according to the fifth aspect of the present invention is produced by the process according to the first aspect of the present invention, the second GaN layer includes a wide region in which the defect density is low.

In a variation of the substrate according to the fifth aspect of the present invention, a plurality of pits each of which has an opening area of 0.005 to 100 $\mu m^2$ and a depth of 0.1 to 10.0 $\mu m$ are formed at the upper surface of the second GaN layer, and a third GaN layer is formed by crystal growth over the second GaN layer so that the upper surface of the third GaN layer is flattened. In this variation, the uppermost (third) GaN layer includes a wide region in which the defect density is further lower.

According to the sixth aspect of the present invention, there is provided a substrate for use in a semiconductor element, comprising: a first GaN layer having a plurality of pits each of which has an opening area of 0.005 to 100 $\mu m^2$ and a depth of 0.1 to 10.0 $\mu m$; a second GaN layer being formed by crystal growth over the first GaN layer and having facets each of which makes an angle of 20 to 70 degrees with the upper surface of the first GaN layer, where a ratio of a total area of portions of the upper surface of the second GaN layer which are parallel to the upper surface of the first GaN layer to a total area of the upper surface of the second GaN layer is 30% or smaller; and a third GaN layer being formed by crystal growth over the second GaN layer and having a flattened upper surface.

Since the substrate according to the sixth aspect of the present invention is produced by the process according to the second aspect of the present invention, the third GaN layer includes a wide region in which the defect density is low.

In a variation of the substrate according to the sixth aspect of the present invention, a plurality of pits each of which has an opening area of 0.005 to 100 $\mu m^2$ and a depth of 0.1 to 10.0 $\mu m$ are formed at the upper surface of the third GaN layer, a fourth GaN layer having facets each of which makes an angle of 20 to 70 degrees with the upper surface of the first GaN layer is formed by crystal growth over the third GaN layer, and a fifth GaN layer is formed by crystal growth over the fourth GaN layer so that the upper surface of the fifth GaN layer is flattened, where a ratio of a total area of portions of the upper surface of the fourth GaN layer which are parallel to the upper surface of the third GaN layer to a total area of the upper surface of the fourth GaN layer is 30% or smaller. In this variation, the uppermost (fifth) GaN layer includes a wide region in which the defect density is further lower.

(4) In the descriptions of the first to sixth aspects of the present invention, "opening area" means the area of the opening at the upper end of each pit, and "depth" means the greatest depth of each pit measured from the upper end of each pit in the vertical direction.

(5) Preferably, the first to sixth aspects of the present invention may have one or any possible combination of the following additional features (i) to (ix).

(i) The plurality of pits are distributed over the upper surface of the first GaN layer with a density of $2.5 \times 10^5$ to $2.5 \times 10^9$ $cm^{-2}$.

(ii) The opening area of each of the plurality of pits is equal to or greater than 2.5 $\mu m^2$.

(iii) The distance between the closest ones of the pits is 0.1 to 10.0 $\mu m$.

(iv) Horizontal cross sections of each of the plurality of pits may have an arbitrary shape. For example, the horizontal cross sections of each of the plurality of pits may have a round or polygonal (e.g., square or equilateral hexagonal) shape. The shapes and opening areas of the plurality of pits may be either identical or different.

(v) Vertical cross sections of each of the plurality of pits need not necessarily have a rectangular shape. For example, the bottom of each pit may be inclined (e.g., an inclined facet may constitute the bottom).

(vi) The plurality of pits may be regularly arranged, for example, with threefold, sixfold, or fourfold symmetry. Alternatively, the plurality of pits may be arranged randomly.

(vii) The processes according to the first and second aspects of the present invention may further comprise a step for forming as an uppermost layer a conductive GaN layer which is doped with a conductive impurity.

(viii) In the processes according to the first and second aspects of the present invention, it is possible to form a GaN film on a base substrate made of a material chosen from sapphire, SiC, ZnO, $LiGaO_2$, $LiAlO_2$, $ZrB_2$, GaAs, GaP, Ge, Si, and the like, and form the first GaN layer on the GaN film. In this case, the base substrate may be removed after the formation of the uppermost GaN layer. Further, it is possible to remove layers from the base substrate up to any layer other than the uppermost GaN layer. For example, it is possible to remove all the layers from the base substrate up to the layer immediately below the uppermost GaN layer, and use only the conductive GaN layer as a substrate.

(ix) In each of the semiconductor elements according to the third and fourth aspects of the present invention, it is possible to remove layers of the substrate from the bottom (e.g., from a base substrate when the substrate is formed on the base substrate) up to any layer other than the uppermost GaN layer.

DESCRIPTION OF THE DRAWINGS

FIGS. 2A and 2B are diagrammatic perspective views of structures in representative stages of a process for producing a substrate in a first variation of the first embodiment of the present invention.

FIGS. 4A and 4B are diagrammatic perspective views of structures in representative stages of a process for producing a substrate in a third variation of the first embodiment of the present invention.

DESCRIPTION OF PREFERRED EMBODIMENTS

Embodiments of the present invention are explained in detail below with reference to drawings.

First Embodiment

Figure 1A:
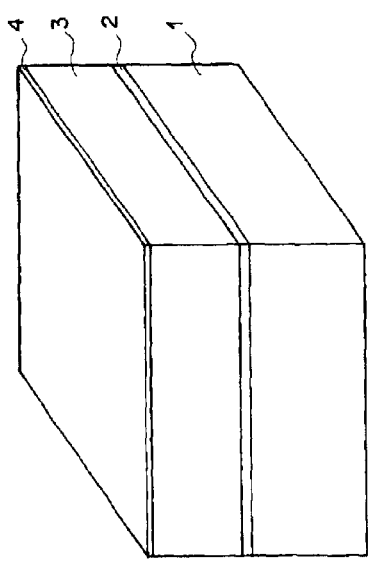
FIGS. 1A to 1D are diagrammatic perspective views of structures in representative stages of a process for producing a substrate in a first embodiment of the present invention.
Figure 1C:
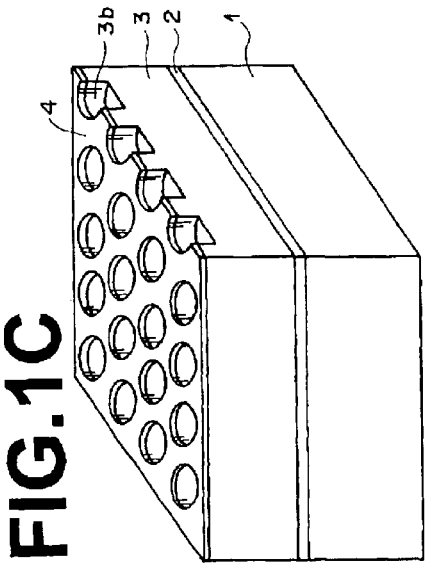
Figure 1B:
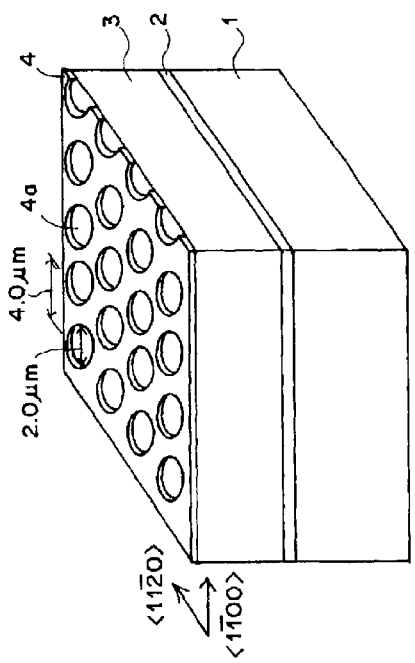
Figure 1D:
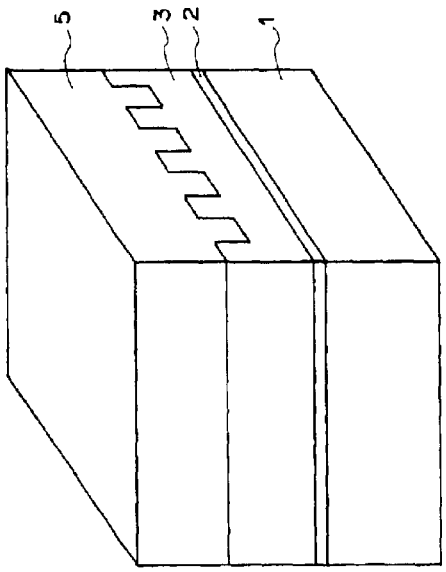

FIGS. 1A to 1D are diagrammatic perspective views of structures in representative stages of a process for producing a substrate for use in a semiconductor element, in a first embodiment of the present invention, where FIG. 1D shows the completed structure of the substrate in the first embodiment.

As illustrated in FIG. 1D, the substrate for use in a semiconductor element, in the first embodiment of the present invention, comprises a base substrate 1, a GaN buffer layer 2 formed on the base substrate 1, a first GaN layer 3 being formed on the GaN buffer layer 2 and having a plurality of pits 3b at its upper surface, and a second GaN layer 5 formed by growing a GaN crystal over the first GaN layer 3 until the upper surface of the second GaN layer 5 becomes flattened.

Each of the above pits 3b in the first GaN layer 3 has an opening area of 0.005 to 100 $\mu m^2$ and a depth of 0.1 to 10.0 $\mu m$. In addition, the distance between the closest ones of the pits 3b is 0.1 to 10.0 $\mu m$. Preferably, the opening area of each pit is 5 to 100 $\mu m^2$.

Since the second GaN layer 5 is formed by selective growth over the first GaN layer 3 in which the plurality of pits 3b are formed, the density of nuclei for growth can be reduced, and therefore the defect density in the GaN layer 5 can be reduced, in comparison with the conventional substrates.

Details of an example of a process for producing the substrate in the first embodiment are explained below with reference to FIGS. 1A to 1D.

In the following example, materials used in the growth of the layers are trimethyl gallium (TMG) and ammonia. In addition, silane gas is used as n-type dopant gas, and cycropentadienyl magnesium ($Cp_2Mg$) is used as p-type dopant gas.

First, as illustrated in FIG. 1A, a GaN buffer layer 2 having a thickness of about 20 nm is formed on a (0001) face of a sapphire substrate 1 (as the base substrate) at a temperature of 500° C. by organometallic vapor phase epitaxy.

Then, a first GaN layer 3 having thickness of about 2.0 micrometers is formed on the GaN buffer layer 2 at a temperature of 1,050° C.

Next, as illustrated in FIG. 1B, a $SiO_2$ layer 4 having a thickness of about 0.5 micrometers is formed on the first GaN layer 3 by plasma CVD (chemical vapor deposition) using $SiH_4$ gas and $N_2O$ gas, and a resist film in which a plurality of openings are patterned by photolithography is formed on the $SiO_2$ layer 4, where each of the plurality of openings has a round shape with a diameter of 2.0 micrometers. Specifically, in the resist pattern, a plurality of windows each having a round shape with a diameter of 2 micrometers are arranged with fourfold symmetry, where the symmetry axes are in the <1$\overline{1}$00> and <11$\overline{2}$0> directions, and the center-to-center distance of the plurality of windows is 4 micrometers. Subsequently, the $SiO_2$ film 4 is etched by RIE (reactive ion etching) dry etching using $CHF_3/O_2$ gas as an etchant and the above resist pattern as a mask, and the resist pattern is removed by the $O_2$ plasma ashing technique. Thus, the $SiO_2$ film 4 becomes a pattern having a plurality of round openings 4a.

Thereafter, as illustrated in FIG. 1C, a plurality of portions of the first GaN layer 3 exposed through the plurality of openings 4a of the $SiO_2$ film 4 are etched to a depth of 1.0 micrometers by the ECR (electron cyclotron resonance) etching using $Cl_2$ gas as an etchant and the $SiO_2$ film 4 as a mask, and then the $SiO_2$ film 4 is removed with hydrofluoric acid. Thus, a plurality of pits 3b each has a cylindrical shape with a diameter of 2.0 micrometers and a depth of 1.0 micrometers are formed.

Further, as illustrated in FIG. 1D, a crystal of a second GaN layer 5 is grown over the first GaN layer 3 at a growth temperature of 1,080° C. by organometallic vapor phase epitaxy, so that the upper portion of each of the plurality of pits 3b is closed by lateral growth and the upper surface of the second GaN layer 5 becomes flattened. Since the growth temperature is relatively high (1,080° C.), the growth speeds in the lateral directions are greater than the growth speed in the vertical direction. Therefore, the second GaN layer 5 grows so as to fill the plurality of pits 3b in the first GaN layer 3.

The present inventors have measured the etch pit densities of the second GaN layer 5 formed as above. In the measurement, the etch pit densities are counted after the substrate is dipped in an etching solution. According to the measurement, the etch pit densities of the second GaN layer 5 formed as above is one to two orders of magnitude smaller than the etch pit densities of the substrates produced on sapphire substrates by the conventional production process.

Variations of First Embodiment

FIGS. 2A and 2B are diagrammatic perspective views of structures in representative stages of a process for producing a substrate in a first variation of the first embodiment of the present invention.

It is possible to form a plurality of pits 5b at the upper surface of the second GaN layer 5 (as illustrated in FIG. 2A), and grow a third GaN layer 7 over the second GaN layer 5 until the upper surface of the third GaN layer 7 becomes flattened (as illustrated in FIG. 2B).

Generally, it is possible to produce a GaN substrate by repeating the following sequence of operations on the second GaN layer 5 of the substrate of FIG. 1D. The sequence includes the steps of formation of a plurality of pits at the upper surface of an uppermost GaN layer and formation of an additional GaN layer by growing a crystal over the uppermost GaN layer until the upper surface of the additional GaN layer becomes flattened. When the above sequence is repeated two or three times, it is possible to obtain a GaN layer in which defects are further reduced. The present inventors have measured the etch pit densities of an uppermost GaN layer which is finally obtained through the repetition of the above sequence. According to the measurement, the etch pit densities of the uppermost GaN layer is four to five orders of magnitude smaller than the etch pit densities of the substrates produced on sapphire substrates by the conventional production process.

Figure 3:
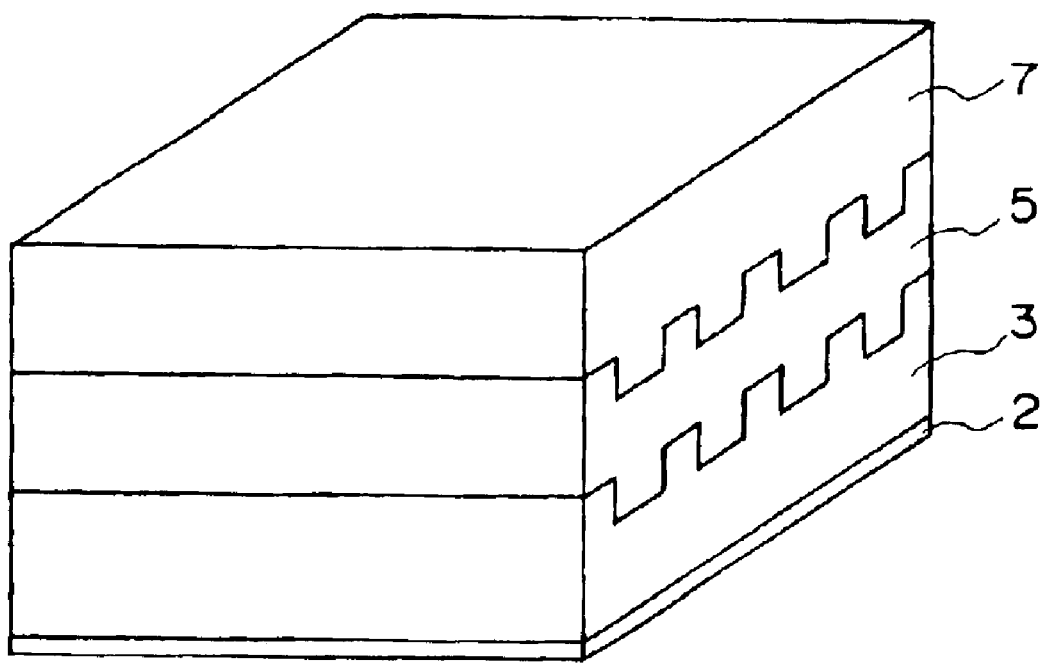
FIG. 3 is a diagrammatic perspective view illustrating a substrate in a second variation of the first embodiment of the present invention.

FIG. 3 is a diagrammatic perspective view illustrating a substrate in a second variation of the first embodiment of the present invention.

Although it is possible to use, as a substrate for a semiconductor element, the structure including all of the layers from the base substrate 1 up to the uppermost GaN layer as illustrated in FIG. 2B, alternatively, it is also possible to use, as a substrate for a semiconductor element, a structure (as illustrated in FIG. 3) which is obtained by removing the base substrate 1 from the structure of FIG. 2B. In either structure, the defect density in the uppermost GaN is reduced. Therefore, when a semiconductor element is produced by forming semiconductor layers on the uppermost GaN layer, the reliability of the semiconductor element is improved.

Although the plurality of pits formed at the upper surface of the GaN layer each have a cylindrical shape in the first embodiment and its variations, the plurality of pits may have various other shapes. That is, the horizontal cross sections of the plurality of pits have arbitrary shapes, for example, polygonal shapes.

Preferably, the depth of each pit is not less than a greater one of 0.1 micrometers and one-third of the width of the opening of each pit (e.g., the diameter in the above embodiment), and at most equivalent to the width of the opening of each pit. Most preferably, the depth of each pit is approximately one-half the width of the opening of each pit. Therefore, the thickness of the GaN layer(s) in which the plurality of pits are formed is designed to be equal to or greater than the etching depth. When the opening of each pit has a round shape, the preferable etching depth is approximately one-half the diameter of the round opening.

In addition, the plurality of pits need not necessarily be arranged with fourfold symmetry. In general, the plurality of pits may be arranged regularly (e.g., with sixfold or threefold symmetry), randomly, or irregularly. In the case of the fourfold, sixfold, or threefold symmetry, the symmetry axes need not necessarily be in the <1$\bar{1}$00> and <11$\bar{2}$0> directions. That is, the symmetry axes may be in any direction.

In the above embodiment, undoped GaN layers are grown. Alternatively, n-type or p-type GaN layers can be grown by introducing a conductive impurity during the growth of GaN. After the growth of the conductive GaN layers, the base substrate 1 can be removed as illustrated in FIG. 3. Thus, it is possible to obtain a conductive substrate for use in a semiconductor laser.

FIGS. 4A and 4B are diagrammatic perspective views of structures in representative stages of a process for producing a substrate in a third variation of the first embodiment of the present invention.

As illustrated in FIG. 4A, a conductive GaN layer 8 having a thickness of about 100 to 200 micrometers is grown over the uppermost GaN layer 7 in the substrate of FIG. 2D, and then the layers other than the conductive GaN layer 8 are removed. Thus, a conductive substrate for use in a semiconductor element is obtained.

When a semiconductor element (e.g., a semiconductor laser element) is produced by forming semiconductor layers including an active layer and the like on a conductive substrate as above, an electrode can be formed on a back surface of the substrate. Therefore, it is possible to simplify the process for producing the semiconductor element.

In each of the first embodiment and its variations, the base substrate can be made of one of sapphire, SiC, ZnO, $LiGaO_2$, $LiAlO_2$, $ZrB_2$, GaAs, GaP, Ge, Si, and the like. In the case where the base substrate is a hexagonal crystal, the substrate face need not necessarily be the (0001) face. That is, the substrate face may be any other faces. Further, it is possible to use as a substrate face a face which forms an offset angle with a predetermined crystal face.

Second Embodiment

Figure 5A:
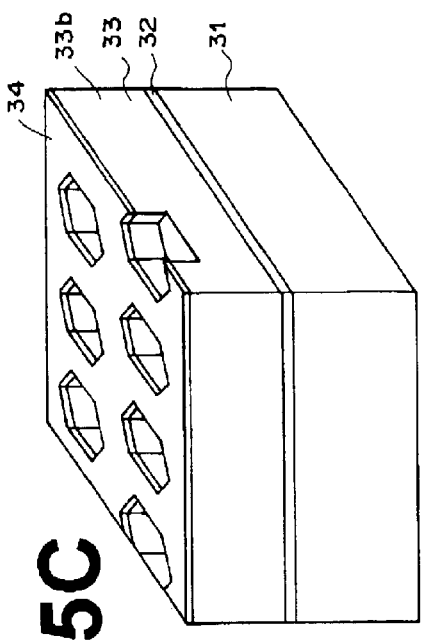
FIGS. 5A to 5D are diagrammatic perspective views of structures in representative stages of a process for producing a substrate in a second embodiment of the present invention.
Figure 5B:
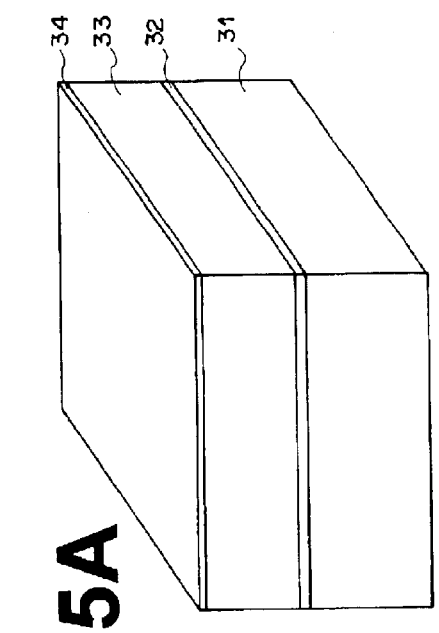
Figure 5C:
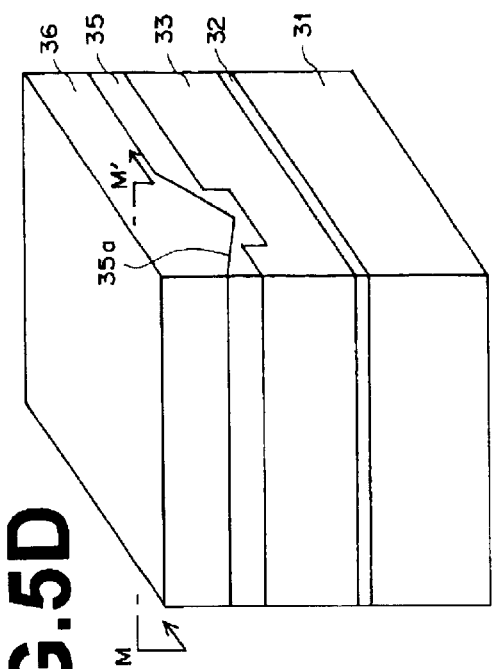
Figure 5D:
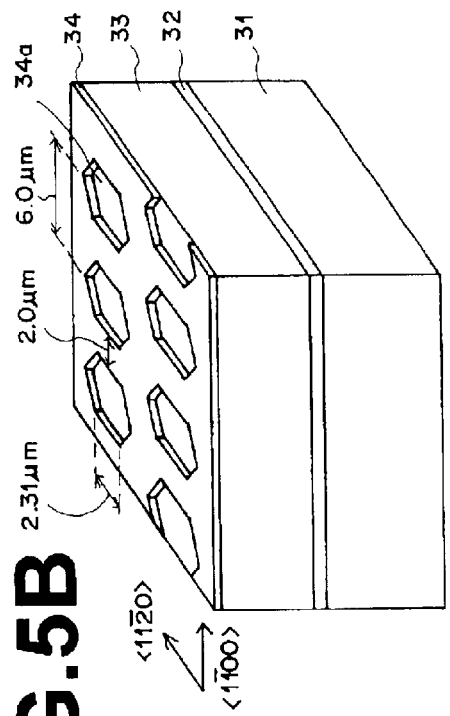

FIGS. 5A to 5D are diagrammatic perspective views of structures in representative stages of a process for producing a substrate for used in a semiconductor element, as a second embodiment of the present invention, where FIG. 5D shows the completed structure of the substrate in the second embodiment.

As illustrated in FIG. 5D, the substrate for use in a semiconductor element, in the second embodiment of the present invention, comprises a base substrate 31, a GaN buffer layer 32 formed on the base substrate 31, a first GaN layer 33 being formed on the GaN buffer layer 32 and having a plurality of pits 33b at its upper surface, a second GaN layer 35 formed over the first GaN layer 33, and a third GaN layer 36 formed by growing a GaN crystal over the second GaN layer 35 until the upper surface of the third GaN layer 36 becomes flattened, where the second GaN layer 35 is formed by growing a GaN crystal over the first GaN layer 33 under a growth condition under which facets each making an angle of 20 to 70 degrees with the upper surface of the first GaN layer 33 are formed, until the ratio of the total area of portions of the upper surface of the second GaN layer 35 which are parallel to the upper surface of the first GaN layer 33 to the total area of the upper surface of the second GaN layer 35 becomes 30% or smaller.

Similar to the first embodiment, each of the above pits 33b in the first GaN layer 33 has an opening area of 0.005 to 100 $\mu m^2$ and a depth of 0.1 to 10.0 $\mu m$, and the distance between the closest ones of the pits 33b is 0.1 to 10.0 $\mu m$.

Details of an example of a process for producing the substrate in the second embodiment are explained below with reference to FIGS. 5A to 5D.

In the following example, materials used in the growth of the layers are trimethyl gallium (TMG) and ammonia ($NH_3$). In addition, silane gas is used as n-type dopant gas, and cycropentadienyl magnesium ($Cp_2Mg$) is used as p-type dopant gas. First, as illustrated in FIG. 5A, a GaN buffer layer 32 having a thickness of about 20 nm is formed on a (0001) face of a sapphire substrate 31 (as the base substrate) at a temperature of 500° C. by organometallic vapor phase epitaxy.

Then, a first GaN layer 33 having thickness of about 3.0 micrometers is formed on the GaN buffer layer 32 at a temperature of 1,050° C.

Next, as illustrated in FIG. 5B, a $SiO_2$ layer 34 having a thickness of about 0.5 micrometers is formed on the first GaN layer 33 by plasma CVD using $SiH_4$ gas and $N_2O$ gas, and a resist pattern having a plurality of openings is formed on the $SiO_2$ layer 34 by photolithography, where each of the plurality of openings has an equilateral hexagonal shape, the length of each side of each equilateral hexagonal opening is $4/\sqrt{3} \approx 2.31$ $\mu m$, and two opposite ones of the six sides of each equilateral hexagonal opening is in the <11$\bar{2}$0> direction. In addition, the plurality of openings are arranged with sixfold symmetry, where the symmetry axis is in the <1$\bar{1}$00> direction, the center-to-center distance is 6.0 micrometers, and the distance between the sides of the closest ones of the plurality of equilateral hexagonal openings is 2.0 $\mu m$.

Subsequently, the $SiO_2$ film 34 is etched by RIE (reactive ion etching) dry etching using $CHF_3/O_2$ gas as an etchant and the above resist pattern as a mask, and the resist pattern is removed by the $O_2$ plasma ashing technique. Thus, the $SiO_2$ film 34 becomes a pattern having a plurality of equilateral hexagonal openings 34a.

Thereafter, as illustrated in FIG. 5C, a plurality of portions of the first GaN layer 33 exposed through the plurality of openings 34a of the $SiO_2$ layer 34 are etched to a depth of 2.0 micrometers by using the ECR (electron cyclotron resonance) etching using the $SiO_2$ film 34 as a mask, and then the $SiO_2$ film 34 is removed with hydrofluoric acid. Thus, a plurality of pits 33b each having an equilateral hexagonal-prism shape and a depth of 2.0 micrometers are formed, where each side of a horizontal cross section of each hexagonal prism-shaped pit has a length of 2.31 micrometers.

Further, as illustrated in FIG. 5D, a crystal of a second GaN layer 35 is grown over the first GaN layer 33 at a growth temperature of 1,000° C. by organometallic vapor phase epitaxy. Since the growth temperature is relatively low (1,000° C.), the growth speed in the vertical direction is greater than the growth speeds in the lateral directions. Therefore, during the growth of the second GaN layer 35, facets 35a in the orientations of (1$\bar{1}$01), (11$\bar{2}$2), and the like and a (0001) face parallel to the upper surface of the first GaN layer 33 are formed at the upper surface of the second GaN layer 35. In particular, the ratio of the area of the (0001) face to the total area of the upper surface of the second GaN layer 35 decreases with the growth of the second GaN layer 35. In this example, the second GaN layer 35 is grown until the second GaN layer 35 completely covers the upper surface of the first GaN layer 33, and no (0001) face is exposed at the upper surface of the second GaN layer 35.

Figure 6:
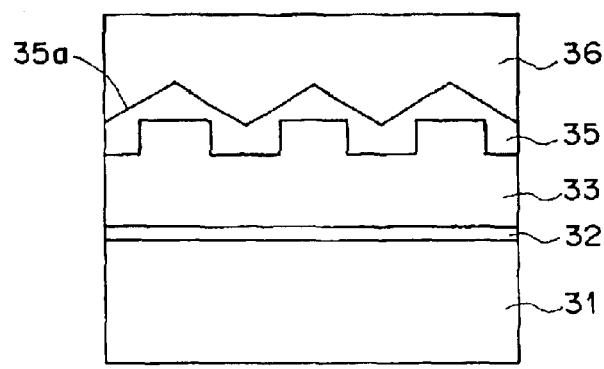
FIG. 6 is a cross-sectional view of the M–M' cross section of the substrate illustrated in FIG. 5D.

FIG. 6 is a cross-sectional view of the M–M' cross section of the substrate illustrated in FIG. 5D. As illustrated in FIG. 6, the upper surface of the second GaN layer 35 has projections and depressions formed with the facets 35a. Since the substrate face is a (0001) face in this embodiment, facets in the above-mentioned orientations (1$\bar{1}$01) and (11$\bar{2}$2) are mainly formed at the upper surface of the second GaN layer 35. Each of these facets forms an angle of about 50 degrees with the (0001) face. However, there is a possibility that facets corresponding to other Miller indexes can appear at the upper surface of the second GaN layer 35. When the substrate face is another face, the Miller indexes of the facets 35a and the angles between the facets 35a and the substrate face will be different.

Thereafter, as illustrated in FIG. 5D, a third GaN layer 36 is grown over the second GaN layer 35 at a growth temperature of 1,100° C. Since the growth temperature is relatively high (1,100° C.), the growth speeds in the lateral directions are greater than the growth speed in the vertical direction. Therefore, the third GaN layer 36 grows so as to fill the depressions of the second GaN layer 35. In this example, the third GaN layer 36 is grown until the upper surface of the third GaN layer 36 becomes flattened (i.e., until the upper surface of the third GaN layer 36 becomes a (0001) face).

The present inventors have measured the etch pit densities of the third GaN layer 36 formed as above. In the measurement, the etch pit densities are counted after the substrate is dipped in an etching solution. According to the measurement, the etch pit densities of the third GaN layer 36 formed as above are two to three orders of magnitude smaller than the etch pit densities of the substrates produced on sapphire substrates by the conventional production process.

Further, the present inventors have produced a GaN, substrate by twice repeating the following sequence of operations on the third GaN layer 36 of the substrate of FIG. 5D. The sequence includes the steps of formation of plurality of pits at the upper surface of an uppermost GaN layer, formation of a first additional GaN layer having facets as the second GaN layer 35 has, over the uppermost GaN layer, and formation of a second additional GaN layer by growing a crystal over the first additional GaN layer until the upper surface of the second additional GaN layer becomes flattened. According to the present inventors' measurement of the etch pit densities, the etch pit densities of an uppermost GaN layer which is finally obtained through the above repetition of the sequence is four to five orders of magnitude smaller than the etch pit densities of the substrates produced on sapphire substrates by the conventional production process.

Variations of First and Second Embodiments

Although $SiO_2$ films are used as the etching masks in the aforementioned embodiments, the etching masks may be made of other materials which can maintain the function of a masking material during etching of GaN layers to a depth of about 1 micrometer. For example, the etching masks may be made of alumina ($Al_2O_3$) or silicon nitride (SiN).

Although organometallic vapor phase epitaxy is used for growing crystals in the above processes, alternatively, crystals may be grown by molecular beam epitaxy (MBE) or hydride vapor phase epitaxy (HVPE).

The ratios of the growth speed of a GaN layer in the vertical direction to the growth speeds in the lateral directions can be changed by changing the growth conditions such as the growth temperature and the V/III ratio in the growth atmosphere, and the like. When growth conditions other than the temperature is selectively set, a GaN layer having facets as described before can be formed by growth at a temperature of 1,080° C. or lower, and a GaN layer having a flattened upper surface as described before can be formed by growth at a temperature of 1,050° C. or higher.

Since the defect densities in the substrates according to the present invention are low, the substrates according to the present invention are reliable, and can be used in production of semiconductor elements and optical or electronic devices in the fields of high-speed, information processing, image processing, communications, laser measurement, medicine, printing, and the like, where the semiconductor elements and the optical or electronic devices include field effect transistors, semiconductor laser elements, semiconductor optical amplifiers, semiconductor light emitting devices, optical detectors, and the like.

Semiconductor Laser Element

A semiconductor laser element as an example of a semiconductor element comprising a substrate according to the present invention is explained below.

Figure 7:
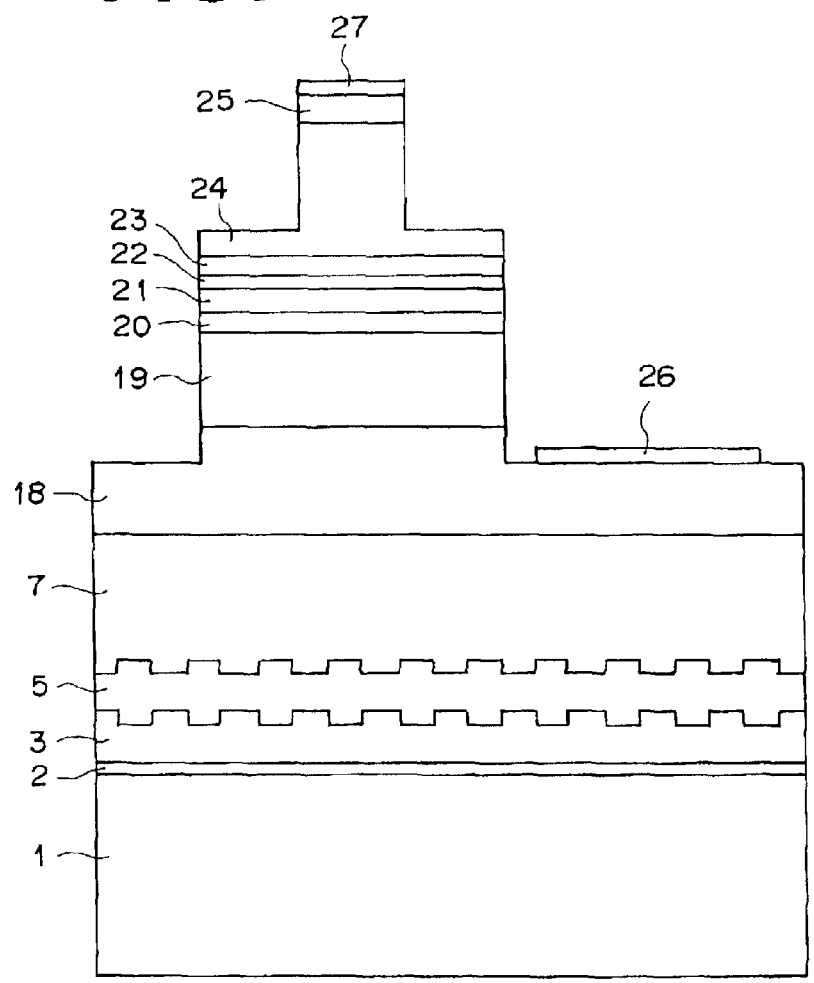
FIG. 7 is a cross-sectional view of a semiconductor laser element using the substrate in the first variation of the first embodiment of the present invention.

FIG. 7 is a cross-sectional view of a semiconductor laser element using the substrate in the first variation of the second embodiment of the present invention. That is, the semiconductor laser element of FIG. 7 comprises the substrate of FIG. 2B.

As illustrated in FIG. 7, an n-type GaN contact layer 18, an n-type $Ga_{1-z1}Al_{z1}N$ (2.5 nm)/GaN (2.5 nm) superlattice cladding layer 19, an n-type $Ga_{1-z2}Al_{z2}N$ optical waveguide layer 20, an $In_{x2}Ga_{1-x2}N$ (Si-doped)/$In_{x1}Ga_{1-x1}N$ multiple-quantum-well active layer 21 (0.5>x1>x2≧0), a p-type $Ga_{1-z3}Al_{z3}N$ carrier blocking layer 22 (1≧z1>z3>z2≧0), a p-type $Ga_{1-z2}Al_{z2}N$ optical waveguide layer 23, a p-type $Ga_{1-z1}Al_{z1}N$ (2.5 nm)/GaN (2.5 nm) superlattice cladding layer 24, and a p-type GaN contact layer 25 are formed on the GaN layer 7 in the substrate of FIG. 2B.

Subsequently, a first $SiO_2$ insulation film (not shown) and a first resist layer (not shown) are formed on the p-type GaN contact layer 25, and regions of the first resist layer and the first $SiO_2$ insulation film other than first stripe regions of the first resist layer and the first $SiO_2$ insulation film having a width of about 30 micrometers are removed by conventional lithography. Then, the regions of the layered structures formed as above on both sides of the first stripe regions are etched to a mid-thickness of the p-type $Ga_{1-z1}Al_{z1}N$ (2.5 nm)/GaN (2.5 nm) superlattice cladding layer 24 by selective etching using RIE, where the thickness of the remaining superlattice cladding layer 24 is determined so as to realize an index-guided structure. Thereafter, the remaining regions of the first resist layer and the first $SiO_2$ insulation film are removed.

Next, a second $SiO_2$ insulation film (not shown) and a second resist layer (not shown) are formed over the layered structures formed as above, regions of the second resist layer and the second $SiO_2$ insulation film other than second stripe regions of the second resist layer and the second $SiO_2$ insulation film are removed, where the second stripe regions are located corresponding to the first stripe regions and 20 micrometers wider than the first stripe regions on each side of the first stripe regions. Then, the regions of the layered structures on both sides of the second stripe regions are etched by RIE until the n-type GaN contact layer 18 is exposed.

Thereafter, by using conventional lithography, an n electrode 26 made of Ti/Al is formed on the n-type GaN contact layer 18, and a p electrode 27 made of Ni/Au is formed on the remaining stripe region of the p-type GaN contact layer 25. Subsequently, the substrate is polished and cleaved so as to form resonator surfaces. Then, a high reflectance coating and a low reflectance coating are applied to the resonator surfaces produced by the cleavage, and the layered structure thus formed is formed into a chip of a semiconductor laser element.

Since, in the above semiconductor laser element, a wide stripe structure is formed on the low-defect GaN layer 7, the reliability of the semiconductor laser element is high even in high output power operation.

When the composition of the active layer is appropriately controlled, the oscillation wavelength of the semiconductor laser element of FIG. 7 can be controlled in the range of 380 to 550 nm.

Although the semiconductor laser element of FIG. 7 is an index-guided semiconductor laser element having a ridge structure and a large stripe width of 30 micrometers, the substrates according to the present invention can also be used in other semiconductor elements including other semiconductor laser elements. Such semiconductor laser elements include index-guided semiconductor laser elements having an internal index-guided structure (realized by a current confinement structure) and index-guided semiconductor laser elements having a buried ridge structure. In addition, the substrates according to the present invention can be used for production of semiconductor laser elements which have a stripe width of about 1 to 2 micrometers and oscillate in a fundamental transverse mode.

The conductivity types of the semiconductor layers in the semiconductor laser element of FIG. 7 may be inverted. That is, the n-type and the p-type may be exchanged.

What is claimed is:

1. A process for producing a substrate for use in a semiconductor element, comprising the steps of:
   (a) forming a first GaN layer having a plurality of pits at an upper surface of the first GaN layer, where each of the plurality of pits has an opening area of 0.005 to 100 $\mu m^2$ and a depth of 0.1 to 10.0 $\mu m$; and
   (b) forming a second GaN layer by growing a GaN crystal over said first GaN layer until an upper surface of the second GaN layer becomes flattened.

2. A process for producing a substrate for use in a semiconductor element, comprising the steps of:
   (a) forming a first GaN layer having a plurality of pits at an upper surface of the first GaN layer, where each of the plurality of pits has an opening area of 0.005 to 100 $\mu m^2$ and a depth of 0.1 to 10.0 $\mu m$;
   (b) forming a second GaN layer by growing a GaN crystal over said first GaN layer under a growth condition under which facets each making an angle of 20 to 70 degrees with the upper surface of the first GaN layer are formed, until a ratio of a total area of portions of an upper surface of the second GaN layer which are parallel to the upper surface of the first GaN layer to a total area of the upper surface of the second GaN layer becomes 30% or smaller; and (c) forming a third GaN layer by growing a GaN crystal over said second GaN layer until an upper surface of the third GaN layer becomes flattened.

3. A semiconductor element comprising:

a substrate; and at least one semiconductor layer formed on said substrate;

wherein said substrate is produced by a process including the steps of, (a) forming a first GaN layer having a plurality of pits at an upper surface of the first GaN layer, where each of the plurality of pits has an opening area of 0.005 to 100 $\mu m^2$ and a depth of 0.1 to 10.0 $\mu m$, and (b) forming a second GaN layer by growing a GaN crystal over said first GaN layer until an upper surface of the second GaN layer becomes flattened.

4. A semiconductor element comprising:

a substrate; and at least one semiconductor layer formed on said substrate;

wherein said substrate is produced by a process including the steps of, (a) forming a first GaN layer having a plurality of pits at an upper surface of the first GaN layer, where each of the plurality of pits has an opening area of 0.005 to 100 $\mu m2$ and a depth of 0.1 to 10.0 $\mu m$, (b) forming a second GaN layer by growing a GaN crystal over said first GaN layer under a growth condition under which facets each making an angle of 20 to 70 degrees with the upper surface of the first GaN layer are formed, until a ratio of a total area of portions of an upper surface of the second GaN layer which are parallel to the upper surface of the first GaN layer to a total area of the upper surface of the second GaN layer becomes 30% or smaller, and (c) forming a third GaN layer by growing a GaN crystal over said second GaN layer until an upper surface of the third GaN layer becomes flattened.

5. A substrate for use in a semiconductor element, comprising:

a first GaN layer having a plurality of pits at an upper surface of the first GaN layer, where each of the plurality of pits has an opening area of 0.005 to 100 $\mu m^2$ and a depth of 0.1 to 10.0 $\mu m$; and a second GaN layer being formed by crystal growth over said first GaN layer and having a flattened upper surface.

6. A substrate for use in a semiconductor element, comprising:

a first GaN layer having a plurality of pits at an upper surface of the first GaN layer, where each of the plurality of pits has an opening area of 0.005 to 100 $\mu m^2$ and a depth of 0.1 to 10.0 $\mu m$;

a second GaN layer being formed by crystal growth over said first GaN layer and having facets each of which makes an angle of 20 to 70 degrees with the upper surface of the first GaN layer, where a ratio of a total area of portions of an upper surface of the second GaN layer which are parallel to the upper surface of the first GaN layer to a total area of the upper surface of the second GaN layer is 30% or smaller; and a third GaN layer being formed by crystal growth over said second GaN layer and having a flattened upper surface.

7. A process for producing a substrate for use in a semiconductor element according to claim 1, wherein said opening area comprises the area of the opening at the upper end of each pit.

8. A process for producing a substrate for use in a semiconductor element according to claim 1, wherein said depth comprises the greatest depth of each pit measured from the upper end of each pit in a vertical direction.

9. A process for producing a substrate for use in a semiconductor element according to claim 1, wherein said flatting of the second GaN layer comprises flattening the second GaN layer until the upper face becomes a (0001) face.

10. A process for producing a substrate for use in a semiconductor element according to claim 1, wherein the distance between the plurality of pits is 0.1 to 10 $\mu m$.

11. A process for producing a substrate for use in a semiconductor element according to claim 1, wherein the opening of each pit has a round shape and wherein the etching depth is one-half the diameter of the round opening.

12. A semiconductor element according to claim 3, wherein said opening area comprises the area of the opening at the upper end of each pit.

13. A semiconductor element according to claim 3, wherein said depth comprises the greatest depth of each pit measured from the upper end of each pit in a vertical direction.

14. A semiconductor element according to claim 3, wherein said flatting of the second GaN layer comprises flattening the second GaN layer until the upper face becomes a (0001) face.

15. A semiconductor element according to claim 3, wherein the distance between the plurality of pits is 0.1 to 10 $\mu m$.

16. A semiconductor element according to claim 3, wherein the opening of each pit has a round shape and wherein the etching depth is one-half the diameter of the round opening.

17. A substrate for use in a semiconductor element according to claim 5, wherein said opening area comprises the area of the opening at the upper end of each pit.

18. A substrate for use in a semiconductor element according to claim 5, wherein said depth comprises the greatest depth of each pit measured from the upper end of each pit in a vertical direction.

19. A substrate for use in a semiconductor element according to claim 5, wherein said flatting of the second GaN layer comprises flattening the second GaN layer until the upper face becomes a (0001) face.

20. A substrate for use in a semiconductor element according to claim 5, wherein the distance between the plurality of pits is 0.1 to 10 $\mu m$.

21. A substrate for use in a semiconductor element according to claim 5, wherein the opening of each pit has a round shape and wherein the etching depth is one-half the diameter of the round opening.

22. A process for producing a substrate for use in a semiconductor element according to claim 1, wherein said plurality of pits are formed by an etching process.

23. A semiconductor element according to claim 3, wherein said plurality of pits are formed by an etching process.

24. A substrate for use in a semiconductor element according to claim 5, wherein said plurality of pits are formed by an etching process.

* * * * *